United States Patent
Antol et al.

(10) Patent No.: US 7,301,231 B2
(45) Date of Patent: Nov. 27, 2007

(54) REINFORCED BOND PAD FOR A SEMICONDUCTOR DEVICE

(75) Inventors: Joze E. Antol, Hamburg, PA (US); Philip William Seitzer, Bethlehem, PA (US); Daniel Patrick Chesire, Winter Garden, FL (US); Rafe Carl Mengel, Hamburg, PA (US); Vance Dolvan Archer, Asbury Park, NJ (US); Thomas B. Gans, Doylestown, PA (US); Taeho Kook, Orlando, FL (US); Sailesh M. Merchant, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 11/448,560

(22) Filed: Jun. 7, 2006

(65) Prior Publication Data

US 2006/0226535 A1    Oct. 12, 2006

Related U.S. Application Data

(62) Division of application No. 10/955,913, filed on Sep. 30, 2004, now Pat. No. 7,115,985.

(51) Int. Cl.
  *H01L 23/522*  (2006.01)

(52) U.S. Cl. .................. 257/700; 257/758; 257/781; 257/784; 257/E23.142

(58) Field of Classification Search ............... 257/700, 257/758, 781, 784, E23.142
See application file for complete search history.

(56) References Cited

U.S. PATENT DOCUMENTS

| 6,844,631 | B2 * | 1/2005 | Yong et al. ............... 257/786 |
| 2004/0130029 | A1 * | 7/2004 | Raaijmakers et al. ....... 257/758 |
| 2005/0145959 | A1 * | 7/2005 | Forbes et al. ............. 257/412 |

* cited by examiner

*Primary Examiner*—Evan Pert
*Assistant Examiner*—Victor A. Mandala, Jr.

(57) ABSTRACT

Disclosed herein are novel support structures for pad reinforcement in conjunction with new bond pad designs for semiconductor devices. The new bond pad designs avoid the problems associated with probe testing by providing a probe region that is separate from a wire bond region. Separating the probe region 212 from the wire bond region 210 and forming the bond pad 211 over active circuitry has several advantages. By separating the probe region 212 from the wire bond region 210, the wire bond region 210 is not damaged by probe testing, allowing for more reliable wire bonds. Also, forming the bond pad 211 over active circuitry, including metal interconnect layers, allows the integrated circuit to be smaller.

7 Claims, 11 Drawing Sheets

REINFORCED BOND PAD FOR A SEMICONDUCTOR DEVICE

RELATED APPLICATIONS

This application is a divisional of U.S. Ser. No. 10/955,913 filed Sep. 30, 2004, now U.S. Pat. No. 7,115,985, which is incorporated herein in its entirety by reference.

BACKGROUND OF THE INVENTION

The present invention relates generally to the fabrication of semiconductor devices, and the packaging of semiconductor devices. More specifically, this invention pertains to bonding pads, probing pads and solder bump pads on semiconductor devices and support structures for bonding pads.

Following the fabrication of the semiconductor devices on a wafer, each device (also known as a chip or die) is tested for functionality, or the wafers are "sorted". Typically, a wafer having devices fabricated thereon is placed on a vacuum chuck. Electrical probes from a tester contact bonding pads formed on each of the devices to determine if individual devices are functional.

After the wafers are sorted, the wafer is cut and the devices are separated from one another using cutting tools known to those skilled in the art. The devices are then assembled onto a substrate using procedures known as die attach or die bonding.

Subsequent to the attachment of the devices to package substrates, electrical connections are made between the bonding pads on the devices and the electrical leads on the package. The electrical connections are made using different techniques including wire bonding, flip-chip bonding and tape-automated bonding. At least with respect to wire bonding, a bonding pad is subjected to a force applied directly to the bond that may damage underlying layers, materials, or components of a device.

In wire bonding techniques, such as thermo-compression, ultra-sonic bonding and thermo-sonic, a metal wire is pressed against a bond pad. Depending on the particular technique, the wire is heated and/or subjected to ultra-sonic vibrations to bond the metal wire to the bonding pad of the semiconductor device. The wire is then connected to electrical leads on the device package.

After the die attachment and wire bonding operations are completed, the device is then "packaged" into a plastic molded package or a ceramic package or similar package, depending upon the die size, package application and end-use.

The devices are subjected to thermal and mechanical stresses during electrical testing during wafer "sort" and subsequent assembly procedures. Damage to the device may be caused during wafer sorting, when the testing probes are pressed against the bonding pad. Probe testing involves the use of a probe needle or other contact devices which may damage and/or contaminate the bond pad. During the probing operation, bond pad metal may be deformed, "gouged" or "ploughed" into one or more regions of the bond pad, exposing underlying layers such as barrier materials, dielectrics and/or other conductors such as aluminum and copper, thus preventing a reliable electrical connection between the bond pad and the packaging pin during subsequent wire bonding. Moreover, the nature of the bond may be mechanically and metallurgically weak, leading to wire lift-off or a "non-stick" (no adherence) situation. This problem is exacerbated by the ever decreasing sizes of bond pad on which smaller wire bonds are formed, leaving very small regions where a sound wire bond is possible. Furthermore, during the wire bond operations, device layers underlying the bond pad are compressed and in some instances materials or components may be cracked and damaged. Dielectric cracking can occur and cracks can propagate through the layer to device components, which in turn may be damaged. Components may also be fabricated underneath the bond pad, and may be damaged directly from the force of the probe and wire bond operations.

Thus, a need exists to provide a bonding pad support structure that effectively protects device components that are disposed within the device directly under the pad in conjunction with minimizing the damage caused by probe testing and wire bonding or flip chip solder bumping. Such a support structure should isolate the damage within an underlying layer to an area subjacent the bonding pad. The structures of the present invention will prevent damage propagation to regions proximal to the bond pad. An added benefit is that the substructure will inhibit bond pad peeling that may result from underlying layer damage.

BRIEF DESCRIPTION OF THE DRAWINGS

Some advantages of the present invention having been stated, others will appear as the description proceeds, when considered in conjunction with the accompanying drawings, which are not necessarily drawn to scale, in which.

DETAILED DESCRIPTION

The subject invention is directed to novel support structures for pad reinforcement in conjunction with new pad designs for semiconductor devices. The new pad designs avoid the problems associated with probe testing by providing a probe region that is separate from a wire bond region. Separating the probe region from the wire bond region and forming the bond pad over active circuitry has several advantages. By separating the probe region from the wire bond region, the wire bond region is not damaged by probe testing, allowing for more reliable wire bonds. Also, forming the bond pad over active circuitry, including metal interconnect layers, allows the integrated circuit to be smaller.

The semiconductor device of the present invention includes at least one bonding pad for testing the functionality of the device and/or for electrically connecting the device to a device package where in the bonding pad comprises a wire bond region and a probe testing region. The support structure under the wire bond region may include at least two metal layers and an insulating layer interposed between the two metal layers. The two metal pads are interconnected by a metal feature extending within the insulating layer. The feature is patterned in such a manner to divide the insulating layer into a plurality of sections, at least a portion of which are disposed within a cross-sectional area of the device defined by a periphery of the bonding pad window. In a preferred embodiment, the feature includes an array of metal-filled recesses, which are arranged to intersect one another, forming a plurality of discrete dielectric sections.

The bond pad support structure is not limited to two interconnected metal layers, but may include two or more metal layers. For example, in a device having seven metal layers, the top three metal layers (M5, M6 and M7) may be interconnected through metal-filled recesses. A first arrangement interconnects layers M5 and M6, and a second arrangement interconnects layers M6 and M7.

In this manner, the metal-filled features in combination with the two metal layers provide a strong composite interconnect structure that distributes the stress and/or force applied during device testing and wire bonding. The support structure minimizes the amount of damage occurring to device components subjacent to the bonding pad. In addition, the isolation of the dielectric sections inhibits propagation of cracking, and ideally confines cracks within a periphery of the array of the recesses.

Figure 1:
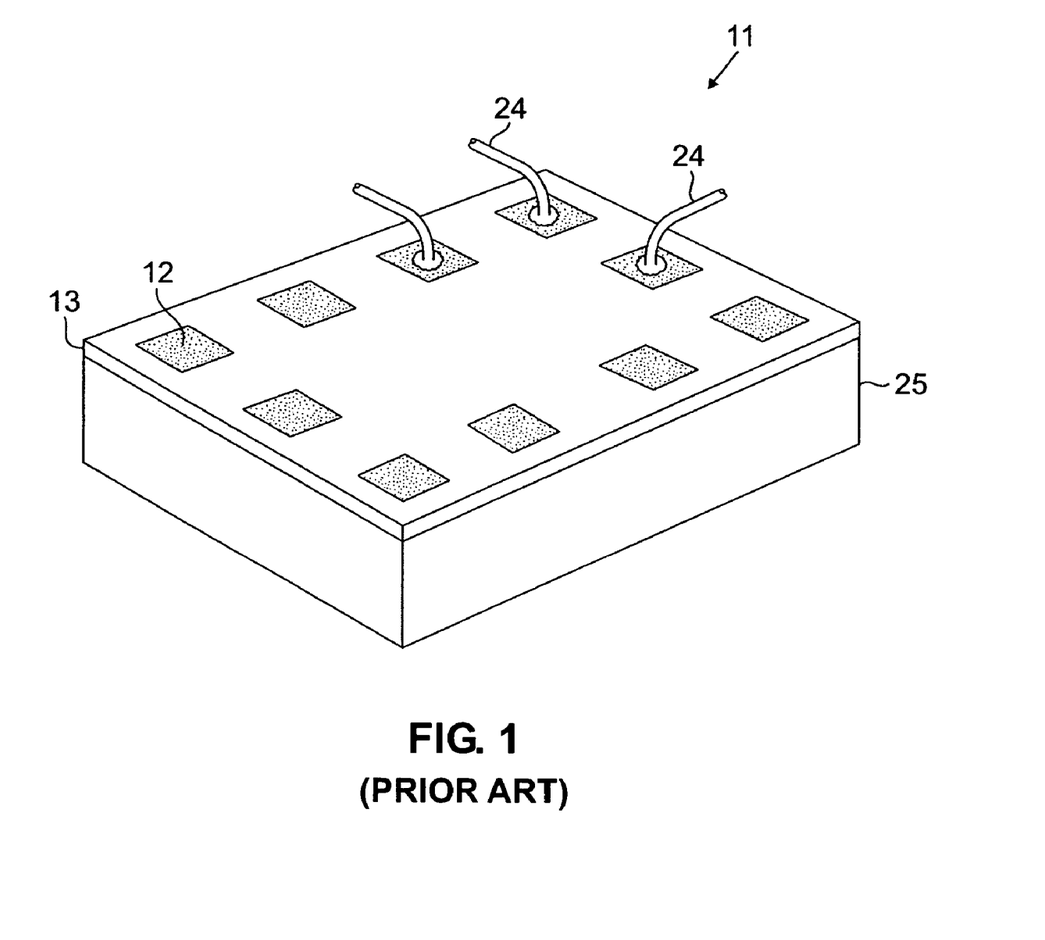
FIG. 1 is a perspective view of a semiconductor device.

Semiconductor devices 11, as shown in FIG. 1, typically include a plurality of metal layers that are separated by insulating layers fabricated over a wafer substrate. The metal layers provide electrical connections between the active regions of the semiconductor device and the bond pads or between various components of the semiconductor device itself. Vias or holes formed within insulating layers are filled with conductive metals to interconnect the various metal layers. The metal layers are formed of conductive materials, for example, aluminum and its alloys, copper and its alloys, or gold.

A semiconductor device 11 is generally depicted in FIG. 1. A passivation layer 13, usually comprising a dielectric material, overlays the underlying composite stack of metal layers, insulating layer and wafer substrate, generally designated as 25. Openings are etched in the passivation layer 13, exposing discrete areas of a top metal layer, forming metal pads 12. These metal pads 12 conventionally serve as connections from the device circuitry to a device package (not shown). Wire bonds 24, solder bumps or tape-automated bonding may be formed on the metal pads 12, for connection to the package substrate (not shown). The invention embodiments disclosed herein will typically be subject to wire bonding and/or probe testing processes, but may be subjected to other processes known in the art such as solder bump processes.

Figure 10:
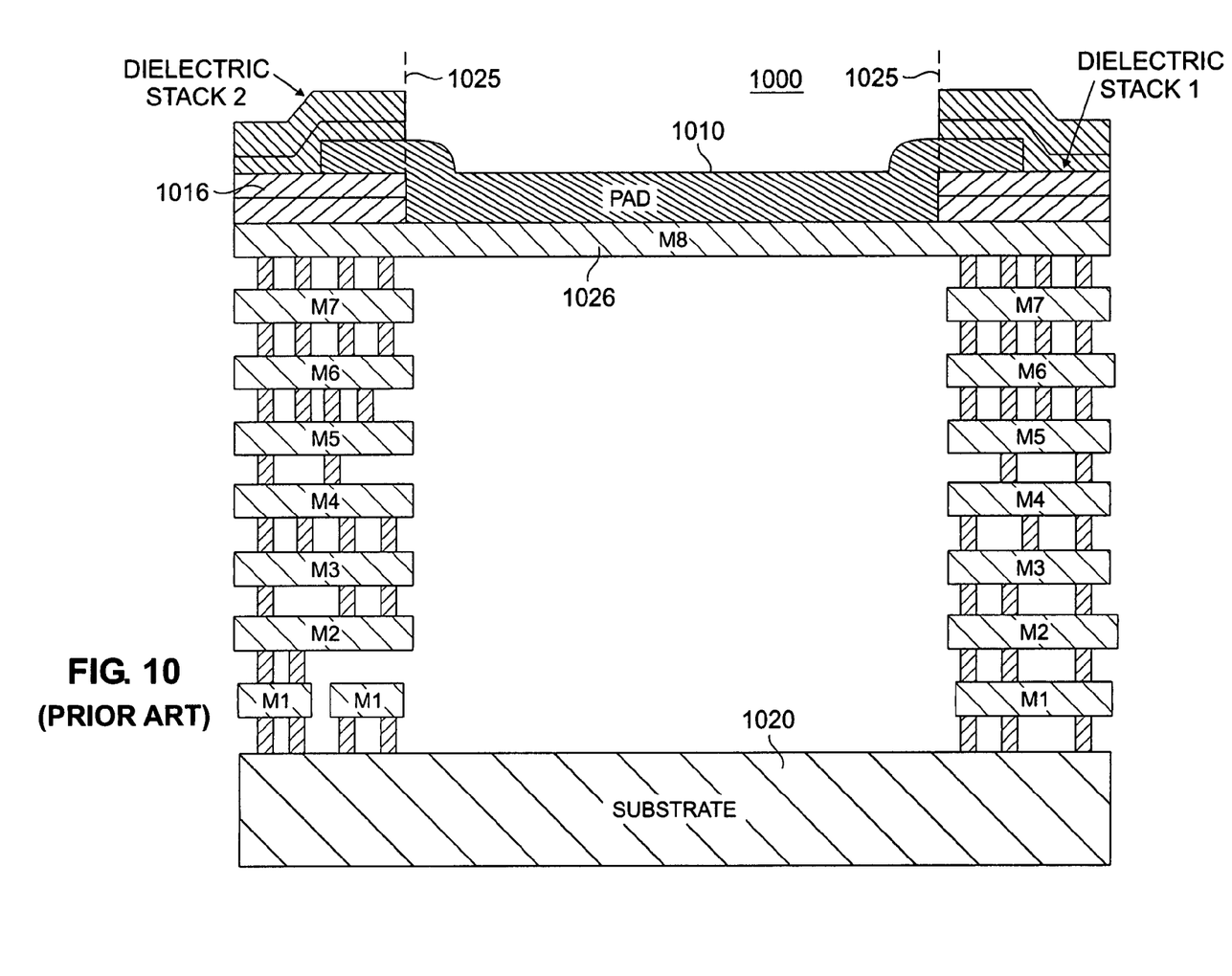
FIG. 10 shows a prior art cross-section of a semiconductor device.

FIG. 10 shows a prior art cross-section of a semiconductor device 1000 comprising a substrate 1020 onto which multiple interconnected metal layers M1-M8 are formed. Above M8 is formed a passivation layer 1016 having an opening formed thereon designated by dashed lines 1025. The opening formed above M8 forms a metal pad 1026. Formed above the metal pad 1026 is an aluminum bond pad 1010. Device 1000 lacks any support structure under the bond pad 1010 and metal pad 1026.

Figure 2:
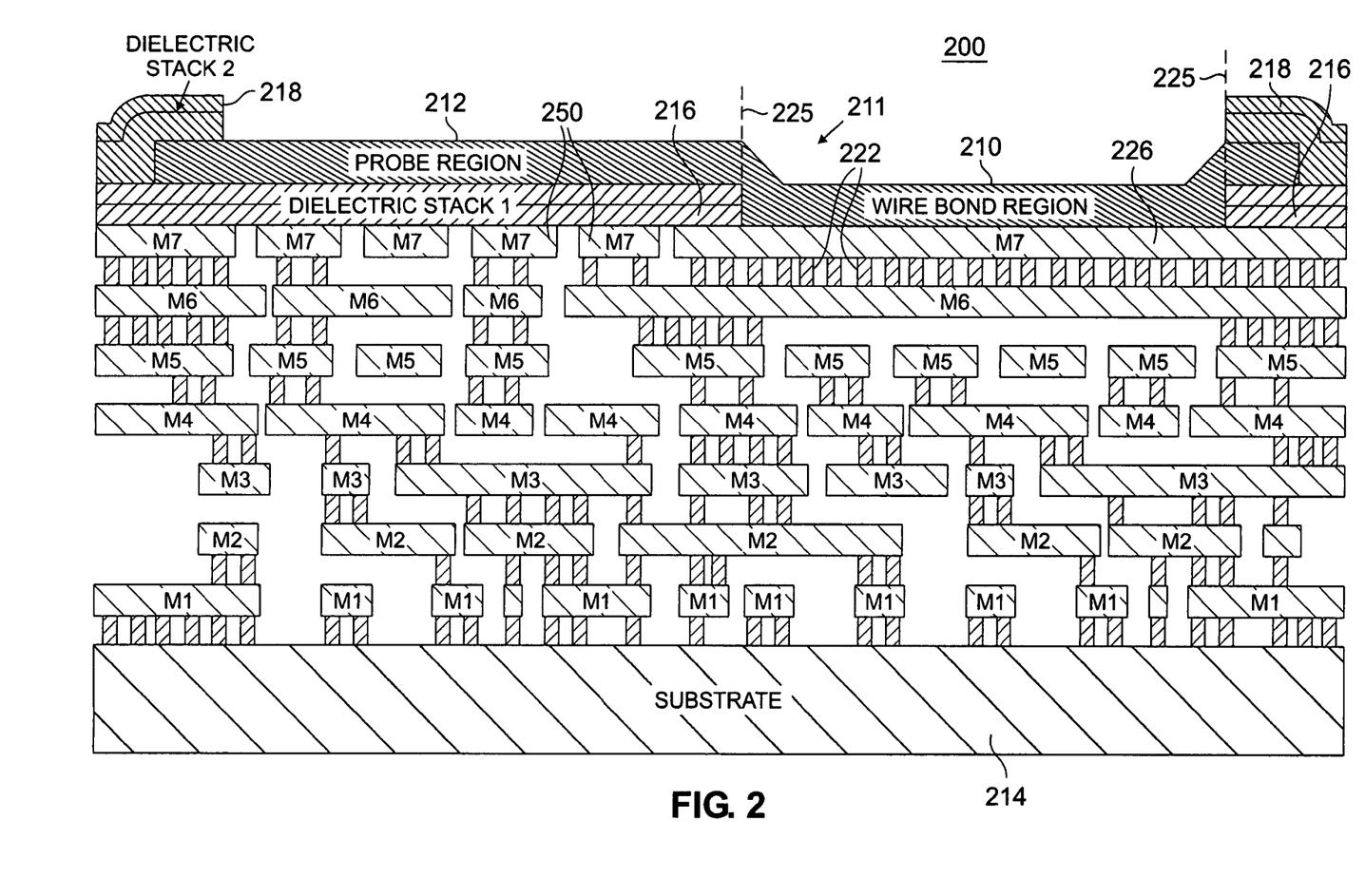
FIGS. 2 through 8 illustrate cross-sectional views of semiconductor device embodiments in accordance with the present invention.

FIG. 2 illustrates one embodiment of a semiconductor device 200 comprising a bond pad 211 having a wire bond region 210 that is separate from a probe region 212. The semiconductor device 200 comprises a substrate 214 onto which several interconnected metal layers are formed. The semiconductor device 200 comprises seven metal layers designated as M1-M7. Those skilled in the art will appreciate that more or less layers may be formed depending on the device design functions. Formed over the top most metal layer, M7, is a first outer passivation layer 216. An opening 225 is formed in the passivation layer 216 between the dashed lines. The top surface of M7 provides a metal pad 226 defined by opening 225. The metal pad 226, and corresponding metal pads discussed in relation to other embodiments below, may be solid or patterned. The semiconductor device 200 comprises a bond pad 211 that is partially formed over the metal pad 226 serving as the wire bond region 210 and partially formed over the first outer passivation layer 216 serving as the probe region 212. Under the probe region 212, is a probe support metal pad 250 that is interconnected with other metal layers in the device 200. When referring to the wire bond region or probe regions substantially disposed over or resting on another layer or structure, this is intended to mean a majority of the wire bond or probe regions that are disposed over or resting on the other layer or structure.

Between M7 and M6 is an insulating layer 228. Formed within the insulating layer 228 and interconnecting M7 and M6 is a plurality of metal features 222. The metal feature(s) 222 are typically patterned, formed and/or etched into the dielectric material of the insulating layer 228 and then filled with a conductive metal. The metal feature may divide or separate the insulating layer into a plurality of sections such as forming a "grid-like or "mesh-like" structure. These metal features 222 may comprise metal filled recesses which are constructed using damascene processes, by which recesses are etched in the dielectric material of the insulating layer 228. A conductive metal is then deposited within the recesses 222 and may or may not be simultaneously deposited to form trenches 250 of M7, depending upon whether a single damascene or dual damascene method of fabrication is employed. In addition to the conventional materials such as aluminum, copper or gold, the conductive metals may include barrier layers or liner/adhesive layers consisting of any number of metals typically used for fabrication in interconnect structures such as refractory metals—tungsten, titanium, tantalum, cobalt or alloys thereof including titanium nitride, or tantalum nitride. Those skilled in the art will immediately recognize the distinction between use of one set of metals and materials over another depending upon whether the method of fabricating the semiconductor device was single damascene or dual damascene. In the single damascene case, upon deposition of the metal into the recesses 222, the excess metal and a subsequently deposited insulating layer 228 may then be planarized using chemical-mechanical polishing techniques as is well documented in the prior art. A metal layer is then fabricated over an insulating layer as described above. If copper is used to fill the recesses 222 in the insulating layer 228, consecutive non-conductive layers and metal layers may be fabricated using a dual damascene process. It also follows, that those skilled in the art will recognize that the embodiments of the present invention can be easily applied if the conductor material is not copper and involves other conventional materials such as aluminum and tungsten.

In this manner, the metal-filled recesses (such as 222) provide an electrical and mechanical interconnection between the respective metal layers M1-M7. The dimensions of the metal plates, the different device layers and metal features will vary according to the gate size of the transistors, as well as the type of metals and to dielectric materials of a semiconductor device. Metal layers may be as thick or thin as necessary to fulfill the device design functions.

The combination of the bond pad 211 having a separate wire bond region 210 and probe region 212 with the support structure formed by the metal layers M7 and M6 and metal features 222 under the wire bond region provides a novel bond pad configuration. The support structure provides resiliency against thermal and mechanical stresses during wire bonding techniques while the separate probe region prevents damage to the wire bond region potentially caused by probe testing.

Formed over the first passivation layer 216 and partially over the bond pad 211 is a second passivation layer 218. The second passivation layer serves to protect the edges of the regions 210 and 212 pad from mechanical and metallurgical damage during wafer dicing, sort and assembly. If the pad was left exposed, corrosion during wafer dicing at the edges of the pad would be observed.

The metal layers M1-7 may be fabricated using processes known to those skilled in the art. For example, damascene process may be used to fabricate the metal layers when copper is used as the conductive metal. Alternatively, a subtractive etch process is typically used to fabricate aluminum metal layers. The non-conductive material of insulating layer 228 may include dielectrics such as silicon dioxide, silicon nitride or other nonconductive materials such as porous dielectrics, polyamides, aerogels, xerogels, other low-k materials or PCBs.

As mentioned above, the insulating layers typically comprise a nonconductive material such as a dielectric material. The thickness of the insulating layer will vary, in part, according to the type of dielectric layers used, and the type of interconnect features formed within the dielectric. Similarly, the size and spacing of the recesses 222 will depend in part on the type of nonconductive material used to fabricate the insulating layer 228. One skilled in the art will appreciate that the size and spacing may vary depending on various factors and limitations as referred to above.

Figure 3:
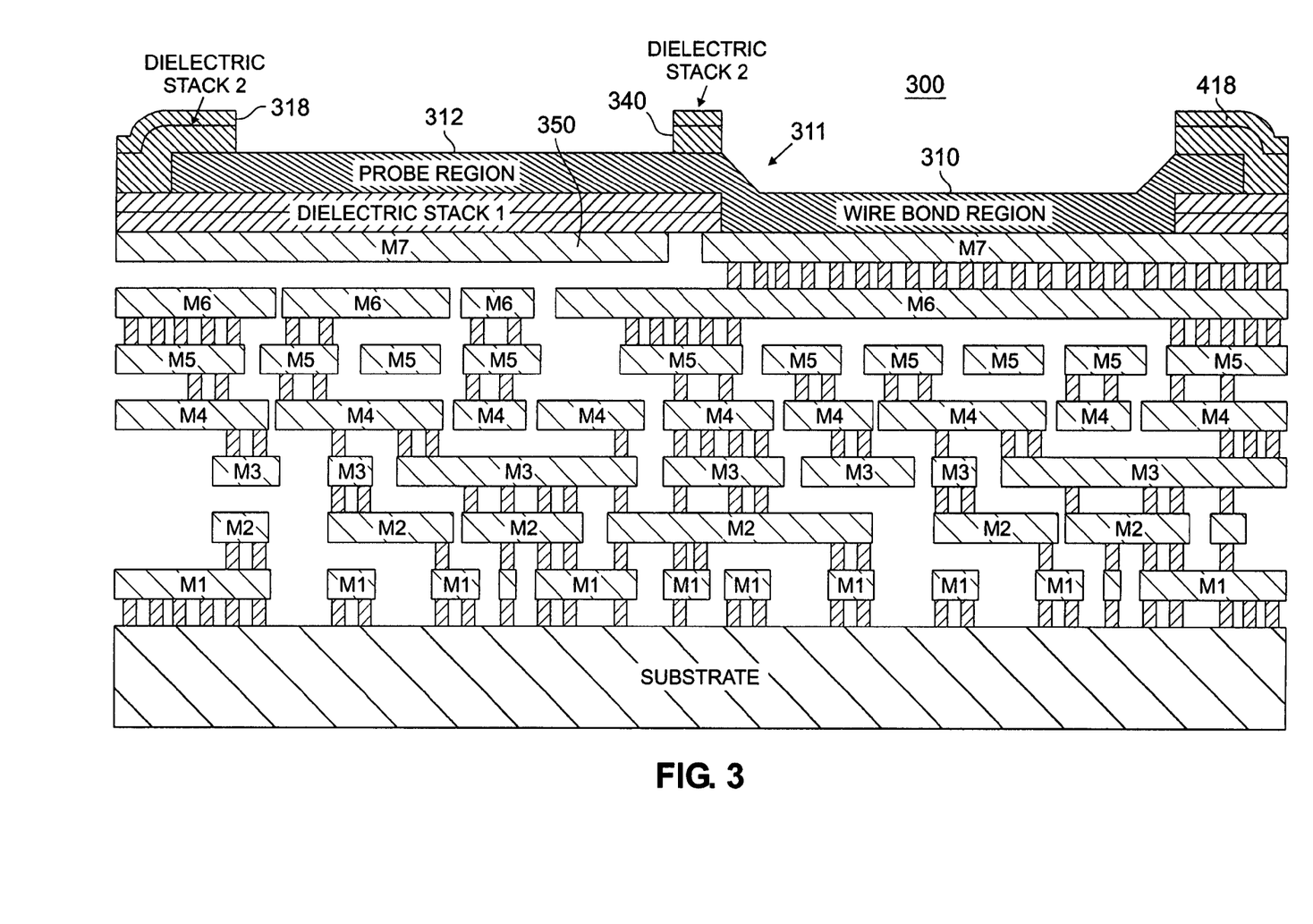

In FIG. 2, metal layers M7 and M6, insulating layer 228, and metal features 222 form what is referred to herein as a 2/1 support structure. This is because there are two metal layers with one intervening dielectric region between a metal support regions, such as metal filled features 222. Turning to FIG. 3, the semiconductor device embodiment 300 has a 2/1 support structure similar to that of device 200. However, device 300 comprises a second outer passivation layer 318 which has been patterned to provide separating region 340 positioned on top of the bond pad 311. The provision of the separating region 340 serves to prevent probe tips from flowing over into the wire bond region 310 during probe testing. In addition, device 300 comprises a floating metal region 350 positioned under the probe region 312. The floating metal region 350 is derived from M7 and may be advantageous to use since it has a different potential than a conventional connected pad, shown as 250 in FIG. 2. This minimizes copper corrosion if any copper is exposed during probing as the pad is electrically isolated from other features on the semiconductor device. The floating metal region 350 provides mechanical stiffness, but provides little reinforcement to the probe region 312.

Figure 4:
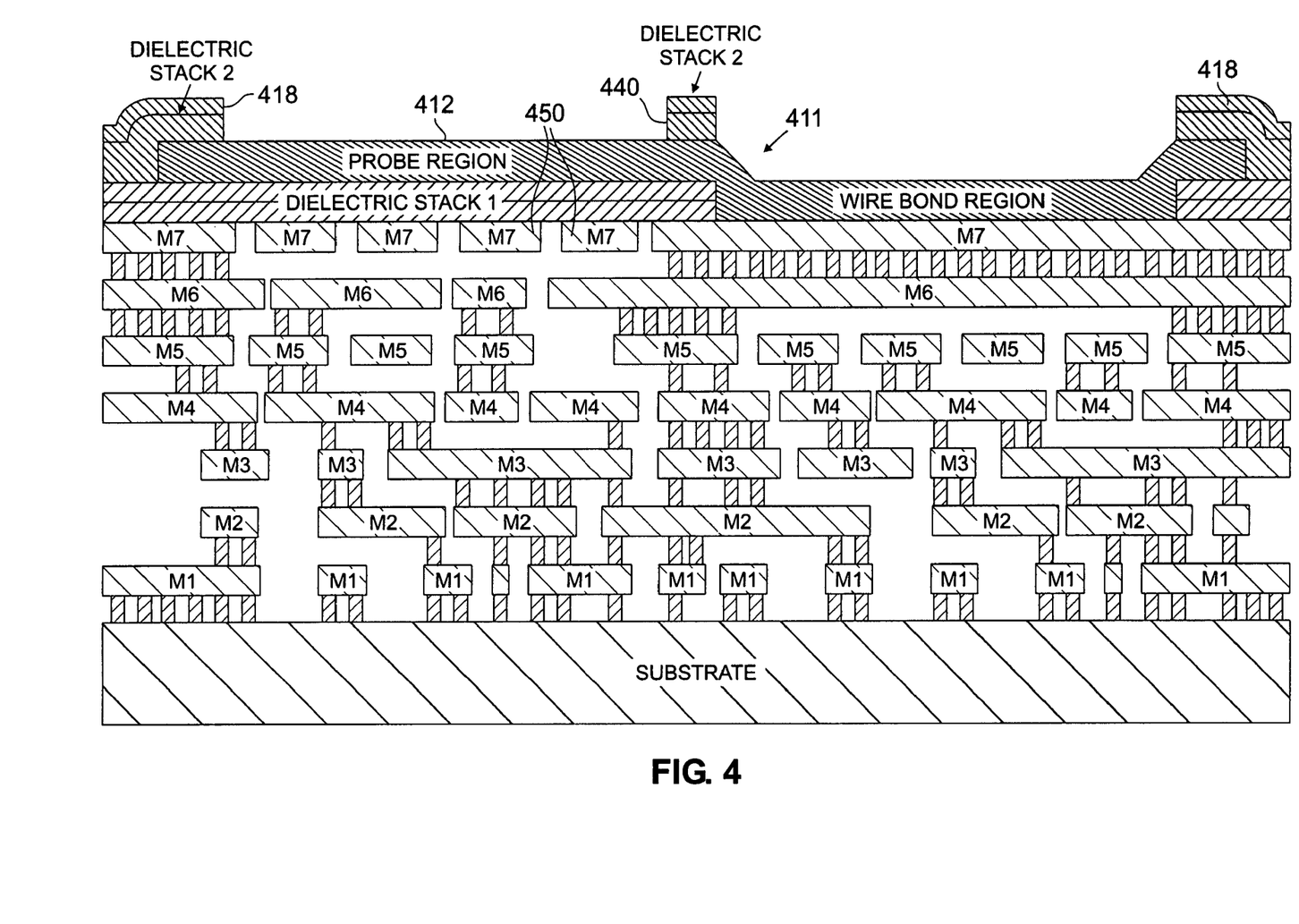

In another embodiment shown in FIG. 4, the probe region 412 is supported by a floating metal region 450 having a "mesh" or "waffle" structure so that the region 450 consists of alternate metal and dielectric areas. The bond pad 411 is separated by a separating region 440 of a second passivation layer 418, similar to device 300.

Figure 5:
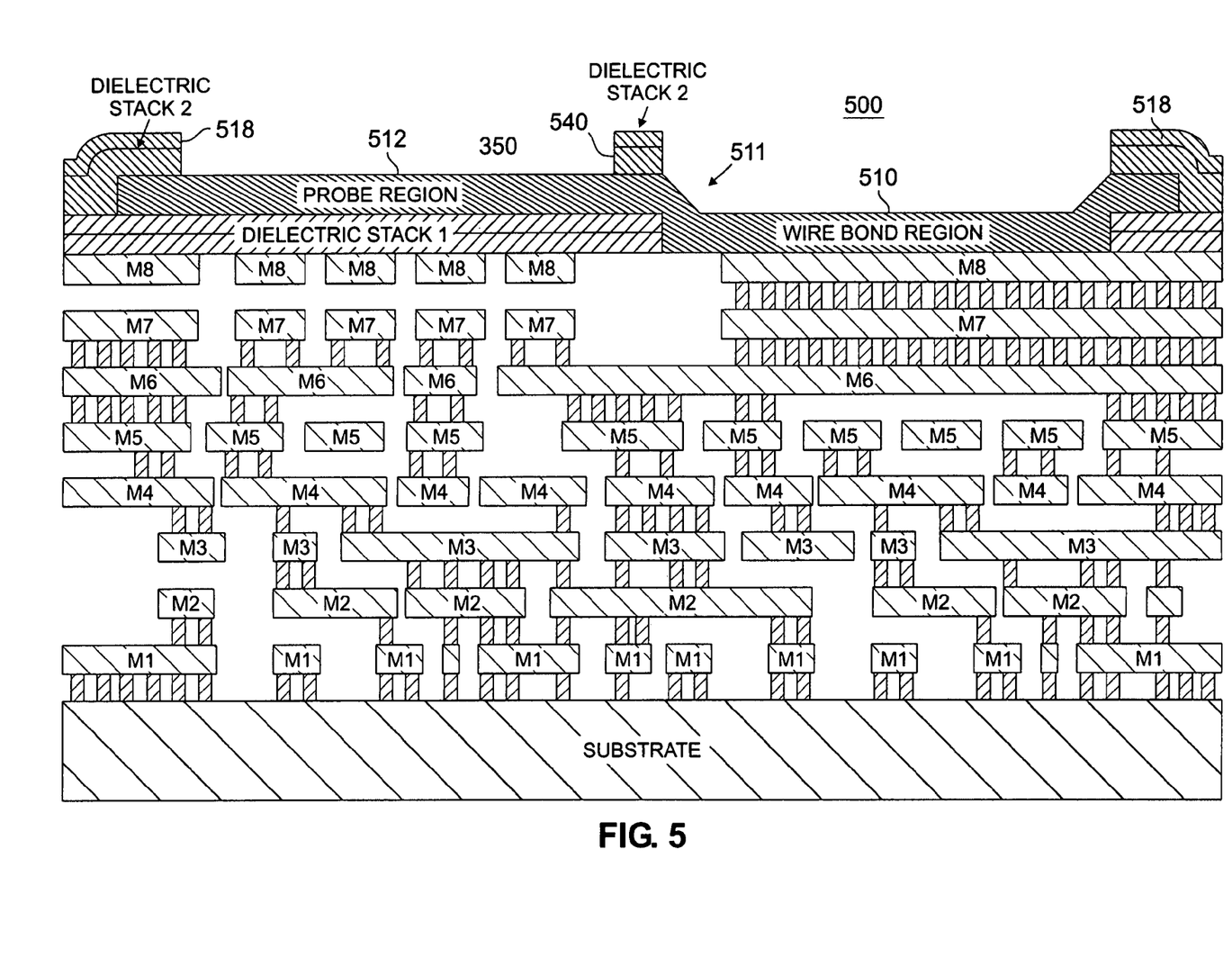

FIG. 5 shows a semiconductor device embodiment 500 of the subject invention wherein metal layers M6, M7 and M8 for a 3/2 support structure, i.e., three metal layers with two metal filled features with intervening dielectric positioned between M5 and M6, M6 and M7. The bond pad has separate wire bond 510 and probe 512 regions that are separated by separating region 540 formed from second passivation layer 518. The probe region is supported by a floating metal pad 540 that is mesh patterned as described above.

Figure 6:
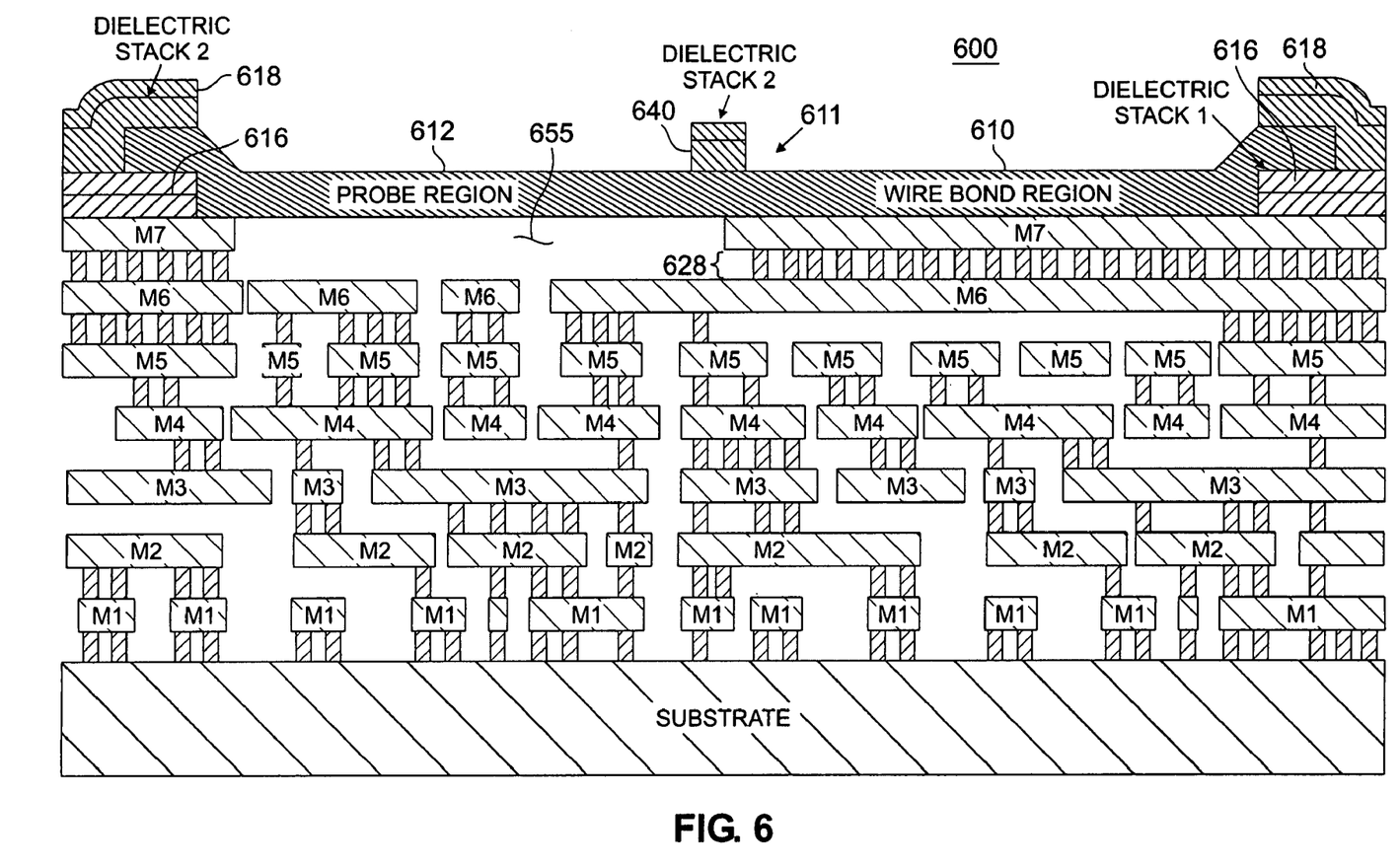

The semiconductor device embodiment 600 shown in FIG. 6 comprises a bond pad 611 comprising a wire bond region 610 and a probe region 612. The wire bond region 610 and probe region 612 are contiguous and coplanar, wherein the probe region 612 generally does not cover a first passivation layer 616. Separating the wire bond region 610 and the probe region 612 is a separating region 640 formed from a second passivation layer 618. The probe region 612 is generally supported by dielectric material 655 immediately subjacent to the probe region 612. The support structure subjacent to the wire bond region 610 is a 2/1 structure formed from metal layers M6 and M7 and intervening dielectric and metal filled features 628.

Figure 7:
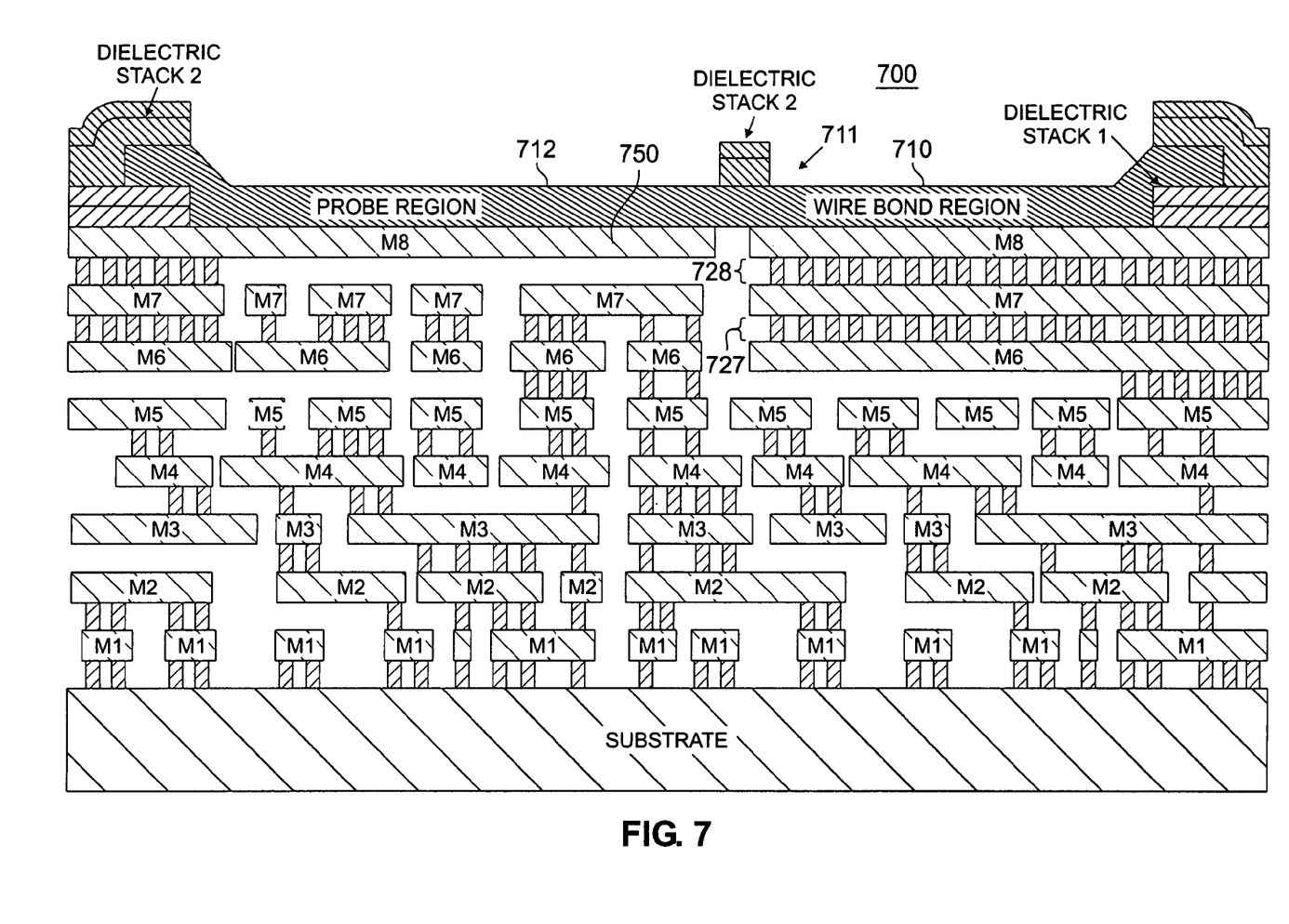

FIG. 7 shows a semiconductor device embodiment 700 similar to embodiment 600 wherein the bond pad 711 comprises a coplanar and contiguous wire bond 710 and probe 712 regions. However, device 700 comprises a 3/2 support structure under wire bond region 710 formed from metal layers M6, M7, and M8 and intervening dielectric and metal filled features 727 and 728. In addition, immediately subjacent to probe region 712 is a metal layer 750 serving to support the probe region 712. The metal layer 750 forms part of the M8 structure and may or may not be a floating metal feature. In one embodiment, layer 750 may be connected to additional metal layers just at the periphery of the probe region 712, as shown in FIG. 7. Note that an additional layer of metal, M8, has been added to previously discussed embodiments, as FIG. 7 describes the 3/2 support structure.

Figure 8:
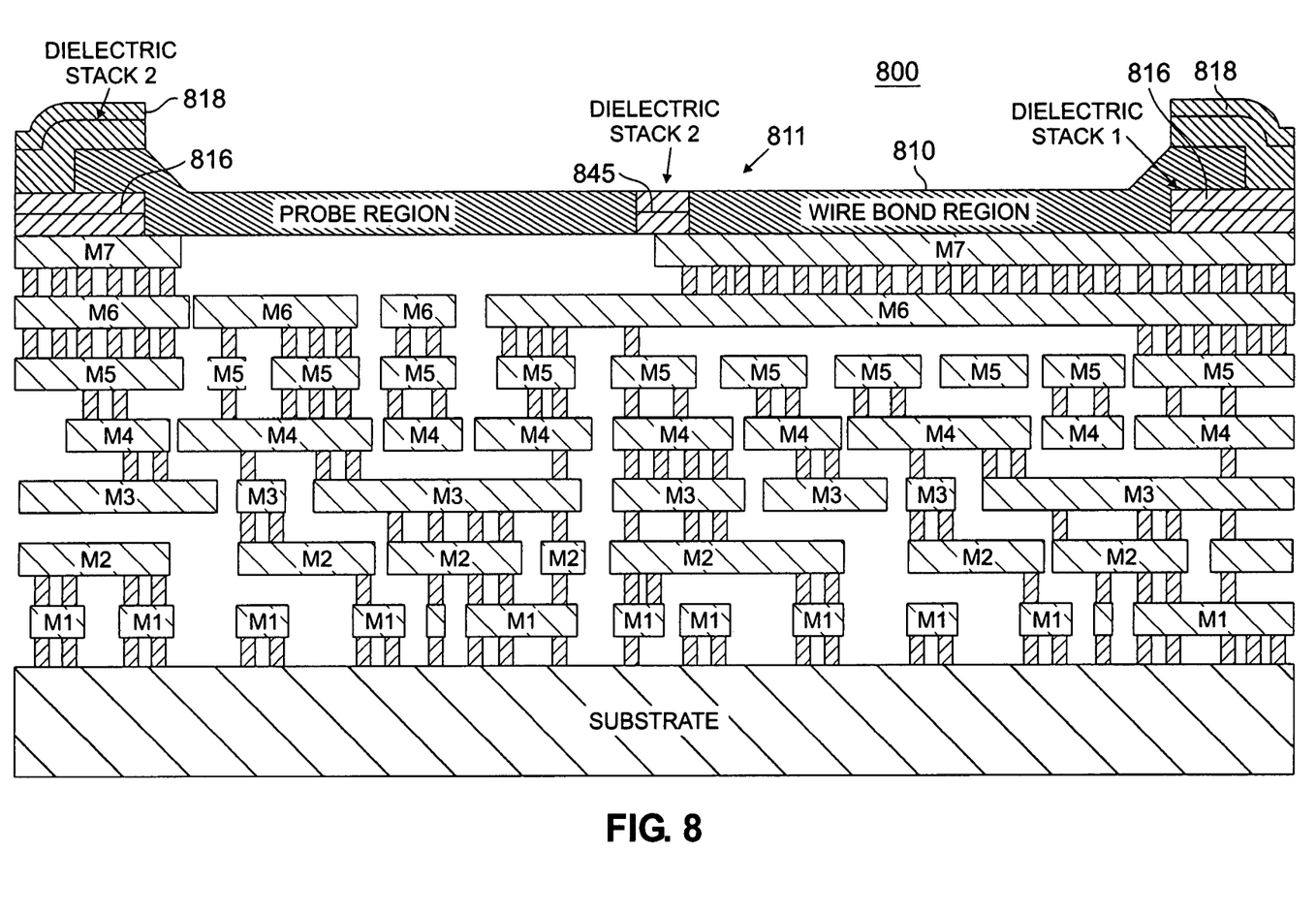

Another semiconductor device embodiment 800 is shown in FIG. 8. Embodiment 800 comprises a bond pad 811 that comprises separate wire bond 810 and probe 812 regions that are coplanar. The wire bond region 810 and probe region 812 are separated by a spacer 845 that does not sit on top of but is coplanar with wire bond 710 and probe 712 regions. Spacer 845 is typically formed from first outer passivation layer 816. The wire bond 810 and probe 812 regions are conductively connected through one or more peripheral connections. The wire bond region 810 is supported by a 3/2 support structure described above. The probe region 812 is supported by a layer of dielectric material. A second passivation layer 818 is formed at least partially over the bond pad 811.

Figure 9A:
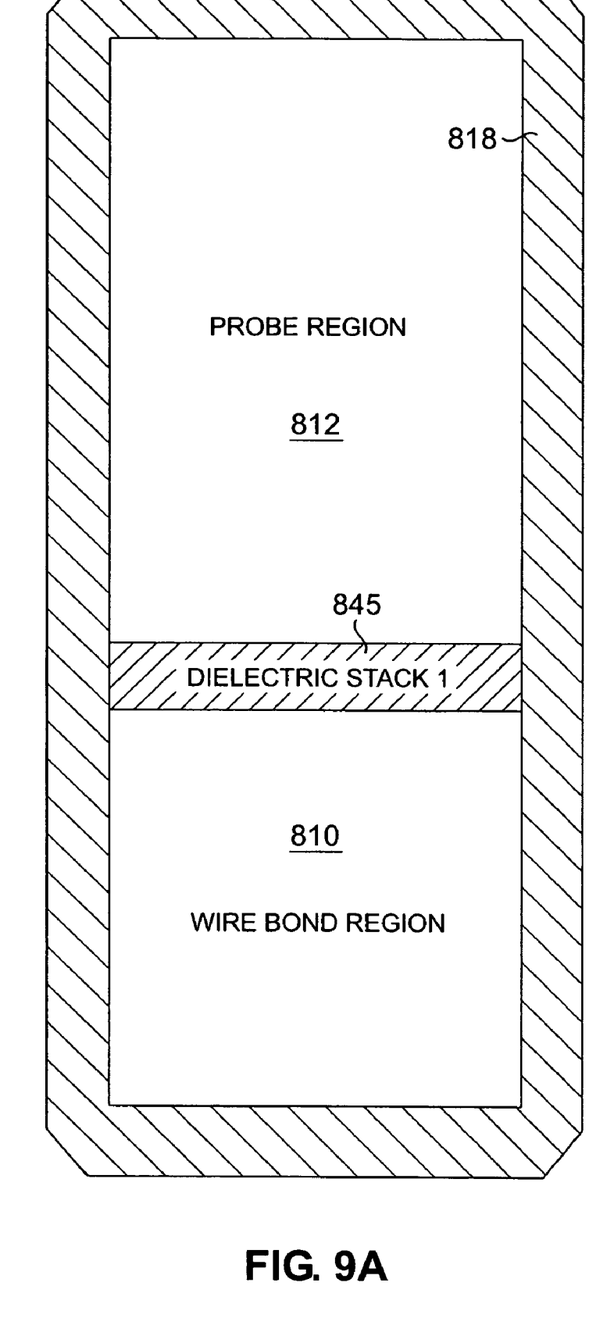
FIG. 9A shows a top planar view of an embodiment of the subject invention with certain parts removed to expose underlying layers and features.
Figure 9B:
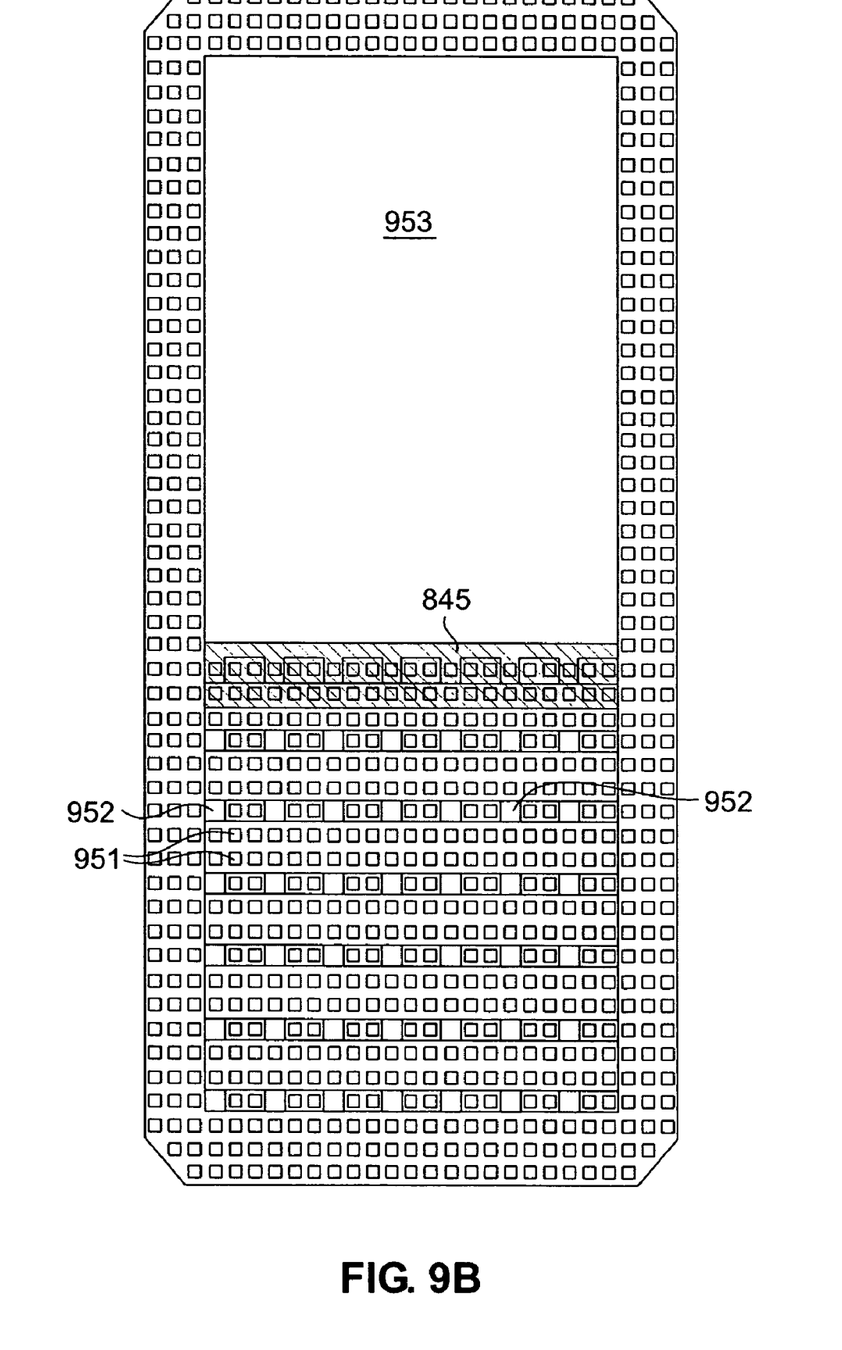
FIG. 9B is a layered or collapsed view of the embodiment shown in FIG. 9A.

FIG. 9A shows a top planar view of the embodiment shown in FIG. 8 showing openings in second passivation layer 818 with separate regions for probing and wire bonding, probe region and wire bond region 812, 810 respectively. The separating region layer 845 separating regions 810 and 812 is also shown. FIG. 9B is a layered or collapsed view depicting features of FIG. 8 through multiple sections, starting from the second passivation layer 818 and opening 816 looking down on top of M7. The layers shown are openings in second passivation layer 818, metal layer M8, and the metal filled recesses 951 between M8 and M7 and adjacent dielectric material 952. Also shown is separating region 845 separating regions 810 and 812. The dielectric region immediately below the probe region 812 is shown at the top of the figure as 953.

As used herein, the term subjacent is given its conventional meaning, i.e., located beneath or below. The term immediately subjacent denotes that some feature or component must be beneath or below another feature or component.

The device embodiments illustrated in FIGS. 2-9 represent various features of the subject invention. Some features may be combined with other features depending on the device design functions. For example, the separate wire bond and probe regions of the bond pad may be coplanar or the probe region may be on an elevated plane relative to the wire bond region. In the latter scenario, the probe region typically rests on a first outer passivation layer. A separating region may be disposed on top of the bond pad to separate the wire bond and probe regions or a separating region may be disposed in between and generally coplanar with the wire bond and probe regions. The support structure under the wire bond region may take the form of a 2/1, 3/2, 4/3 etc. structure. The probe region may be supported by an interconnected pad, floating metal pad, a floating, mesh pad, or a layer of dielectric material. The probe region support may be separated from the probe region by the first outer passivation layer. One or more of the foregoing features may be combined based on the constraints of the device and intended device function.

While the preferred embodiments of the present invention have been shown and described herein in the present context, it will be obvious that such embodiments are provided by way of example only and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

The invention claimed is:

1. A reinforced bond pad configuration formed on a semiconductor device, said configuration comprising
   a first outer positioned passivation layer formed on the device comprising at least one opening formed therein having a periphery;
   at least two metal layers formed on the device subjacent to the first outer positioned passivation layer wherein the at least one opening formed exposes a top surface of a top metal layer thereby forming a metal pad;
   a first insulating layer interposed between the at least two metal layers;
   a plurality of metal features formed within the insulating layer between the at least two metal layers of the device, a portion of which are disposed within a cross-sectional area of the device defined by said opening periphery so as to reinforce said metal pad; and
   a bond pad formed over and in contact with said metal pad, said bond pad comprising a probe region and a wire bond region, wherein said wire bond region substantially covers said metal pad, and wherein said wire bond region and said probe region are separated by a separating region form from the first passivation layer that is coplanar with at least one of said wire bond region and said probe region.

2. The reinforced bond pad configuration of claim 1 wherein said probe region and said wire bond region are coplanar and contiguous.

3. The reinforced bond pad configuration of claim 1, wherein probe region is supported by a floating metal region subjacent to said probe region.

4. The reinforced bond pad configuration of claim 1, wherein said probe region is supported by an interconnected metal pad subjacent to said probe region.

5. A reinforced bond pad configuration formed on a semiconductor device, said configuration comprising:
   a first outer positioned passivation layer formed on the device comprising at least one opening formed therein having a periphery;
   at least two metal layers formed on the device subjacent to the first outer positioned passivation layer wherein the at least one opening formed exposes a top surface of a top metal layer thereby forming a metal pad;
   a first insulating layer interposed between the at least two metal layers;
   a plurality of metal features formed within the insulating layer between the at least two metal layers of the device, a portion of which are disposed within a cross-sectional area of the device defined by said opening periphery so as to reinforce said metal pad; and
   a bond pad formed over and in contact with said metal pad, said bond pad comprising a probe region and a wire bond region wherein said wire bond region substantially covers said metal pad, and wherein said wire bond region and said probe region are separated by a separating region formed from said first passivation layer that is coplanar with said wire bond region and said probe region.

6. A reinforced bond pad configuration formed on a semiconductor device, said configuration comprising:
   a first outer positioned passivation layer formed on the device comprising at least one opening formed therein having a periphery;
   at least two metal layers formed on the device subadjacent to the first outer positioned passivation layer wherein the at least one opening formed exposes a top surface of a top metal layer thereby forming a metal pad;
   a first insulating layer interposed between the at least two metal layers, wherein said at least two metal layers comprises three metal layers with said first insulating layer interposed between a bottom metal layer and middle metal layer of said three metal layers and a second insulating layer interposed between said middle metal layer and a top metal layer of said three metal layers so as to form a 3/2 structure;
   a plurality of metal features formed within the insulating layer between the at least two metal layers of the device, a portion of which are disposed within a cross-sectional area of the device defined by said opening periphery so as to reinforce said metal pad; and
   a bond pad formed over and in contact with said metal ad said bond pad comprising a probe region and a wire bond region, wherein said wire bond region substantially covers said metal pad.

7. A reinforced bond configuration formed on a semiconductor device, said configuration comprising:
   a first outer positioned passivation layer formed on the device comprising at least one opening formed therein having a periphery;
   at least two metal layers formed on the device subadjacent to the first outer positioned passivation layer wherein the at least one opening formed exposes a top surface of a top metal layer thereby forming a metal pad;
   a first insulating layer interposed between the at least two metal layers;
   a plurality of metal features formed within the insulating layer between the at least two metal layers of the device, a portion of which are disposed within a cross-sectional area of the device defined by said opening periphery so as to reinforce said metal pad; and
   a bond pad formed over and in contact with said metal pad, said bond pad comprising a probe region and a wire bond region, wherein said wire bond region substantially covers said metal pad, and wherein said wire bond region and said probe region are separated by a separating region formed from said first passivation layer that is coplanar and contiguous with said wire bond region and said probe region.

* * * * *